(12) United States Patent  (10) Patent No.: US 11,689,014 B2
Krishnamoorthy et al.  (45) Date of Patent: Jun. 27, 2023

(54) ELECTROSTATIC DISCHARGE CIRCUIT FOR MULTI-VOLTAGE RAIL THIN-GATE OUTPUT DRIVER

(71) Applicant: QUALCOMM Incorporated, San Diego, CA (US)

(72) Inventors: Satish Krishnamoorthy, San Diego, CA (US); Young Uk Yim, San Diego, CA (US); Ashwin Sethuram, San Clemente, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 36 days.

(21) Appl. No.: 17/357,239

(22) Filed: Jun. 24, 2021

(65) Prior Publication Data

US 2022/0416536 A1    Dec. 29, 2022

(51) Int. Cl.
    *H02H 9/02*      (2006.01)
    *H01L 27/02*     (2006.01)

(52) U.S. Cl.
    CPC .......... *H02H 9/02* (2013.01); *H01L 27/0255* (2013.01); *H01L 27/0292* (2013.01)

(58) Field of Classification Search
    CPC . H02H 9/02; H02H 9/046; H02H 3/08; H01L 27/0255; H01L 27/0248; H01L 29/861; H01L 27/0292
    USPC .......................................................... 361/56
    See application file for complete search history.

(56) References Cited

U.S. PATENT DOCUMENTS

| | | | |
|---|---|---|---|
| 5,430,595 A | 7/1995 | Wagner et al. | |
| 5,814,865 A | 9/1998 | Duvvury et al. | |
| 6,045,209 A | 4/2000 | Imai | |
| 6,130,557 A * | 10/2000 | Drapkin | H03K 19/00315 326/83 |
| 7,764,475 B2 | 7/2010 | Sung et al. | |
| 8,068,319 B1 | 11/2011 | Chan | |
| 9,368,485 B1 * | 6/2016 | Chu | H01L 27/0255 |
| 10,134,725 B2 | 11/2018 | Lee | |
| 2001/0024348 A1 | 9/2001 | May et al. | |
| 2007/0153437 A1 * | 7/2007 | Bartenschlager | H01L 27/0251 361/56 |
| 2013/0063843 A1 * | 3/2013 | Chen | H01L 23/552 361/56 |

(Continued)

OTHER PUBLICATIONS

International Search Report and Written Opinion—PCT/US2022/032864—ISA/EPO—dated Oct. 14, 2022.

*Primary Examiner* — Danny Nguyen
(74) *Attorney, Agent, or Firm* — Loza & Loza, LLP

(57) ABSTRACT

An ESD protection circuit in an interface circuit has a first diode coupled between a first power source of an integrated circuit device and an input/output pad of the integrated circuit device, a second diode coupled between a second power source of the integrated circuit device and the input/output pad, and a resistive element that couples the second diode to the first diode and to the input/output pad. The first power source supplies a driver circuit coupled to the input/output pad. The second power source supplies one or more core circuits of the integrated circuit device. The resistive element may be implemented as an interconnect configured to provide a resistance that produces a voltage differential between a terminal of the second diode and a corresponding terminal of the first diode during an electrostatic discharge event.

39 Claims, 7 Drawing Sheets

(56) References Cited

U.S. PATENT DOCUMENTS

| | | |
|---|---|---|
| 2016/0268248 A1 | 9/2016 | Fan et al. |
| 2019/0326751 A1 | 10/2019 | Xi |
| 2020/0243485 A1* | 7/2020 | Su .................. H03K 19/017509 |
| 2020/0333818 A1* | 10/2020 | Yun .......................... G11C 5/04 |

* cited by examiner

700

```
        ┌──────────────────┐
        │  ESD Protection  │
        └────────┬─────────┘
                 ▼
```

— 702

Couple a first diode between a first power source of an integrated circuit device and an input/output pad of the integrated circuit device, the first diode being configured to divert a first portion of an electrostatic discharge current that is conducted through the input/output pad, wherein the first power source supplies a driver circuit coupled to the input/output pad

— 704

Couple a second diode between a second power source of the integrated circuit device and the input/output pad, the second diode being configured to divert a second portion of the electrostatic discharge current, and wherein the second power source is associated with a power domain that supplies one or more core circuits of the integrated circuit device

— 706

Couple the second diode to the first diode through a resistive element, wherein the second diode is coupled to the input/output pad through the resistive element

*FIG. 7*

ELECTROSTATIC DISCHARGE CIRCUIT FOR MULTI-VOLTAGE RAIL THIN-GATE OUTPUT DRIVER

TECHNICAL FIELD

The present disclosure generally relates to interface circuits for integrated circuits and, more particularly, to circuits that can enhance electrostatic discharge protection in multi-voltage rails in interface circuits.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Continuous service enhancements require the advancement of process technologies that can provide integrated circuit (IC) devices with ever increasing performance and transistor densities.

Advancements in process technologies tend to reduce transistor gate length and other feature sizes with IC devices. Reductions in gate length and feature sizes can increase the susceptibility of IC devices to electrostatic discharge (ESD) events. IC devices often include ESD protection circuits that can protect interface circuits during different types of ESD events. IC devices may be tested to ensure that they meet minimum industry standards regarding ESD protection. IC device qualification processes may include testing the susceptibility of the IC device to ESD events based on a human-body model (HBM) or based on a charged-device model (CDM) characterization of ESD events. Some ESD protection circuits are based on or evaluated using an HBM or a CDM. The HBM is intended to characterize the susceptibility of devices to damage from ESD events of ±1 kVolt resulting from human touching of an electronic device. The CDM is intended to characterize the susceptibility of devices to damage from ESD events of ±250 Volts that relate to sudden discharges of energy accumulated in an IC chip or package through direct contact charging or field-induced charging.

Changes in certain aspects of large scale IC designs and semiconductor manufacturing processes, including reductions in process minimum feature size can create new or different susceptibilities of IC devices to ESD events. Accordingly, there is an ongoing need for improvements in ESD protection for IC interface circuits.

SUMMARY

Certain aspects of the disclosure relate to systems, apparatus, methods and techniques that can provide enhanced ESD protection circuits in certain IC devices, including IC devices that employ multiple voltage domains. Some examples disclosed herein are applicable to interface circuits in an IC, including in high-speed, low-power synchronous dynamic random access memory. Some examples disclosed herein are applicable to the protection of circuits at the boundary between a low-voltage domain that is used to implement certain core features of the IC device and a higher-voltage domain that is used for device input and output (input/output or I/O).

In one aspect of the disclosure, an ESD protection circuit in an interface circuit has a first diode coupled between a first power source of an IC device and an I/O pad of the IC device, a second diode coupled between a second power source of the IC device and the I/O pad, and a resistive element that couples the second diode to the first diode and to the I/O pad. The power source may supply a driver circuit coupled to the I/O pad. The second power source may supply one or more core circuits of the IC device.

In one aspect of the disclosure, an apparatus has means for driving an I/O pad of an IC device, means for diverting a first portion of an ESD current that is conducted through the I/O pad, including a first diode in an interface circuit, the first diode being coupled between a first power source of the IC device and the I/O pad, and means for diverting a second portion of the ESD current, including a second diode in the interface circuit, the second diode being coupled between a second power source of the integrated circuit device and the I/O pad. The first power source may supply the means for driving the I/O pad. The second power source may supply one or more core circuits of the IC device. A terminal of the second diode may be coupled to the I/O pad through a resistive element coupled to a corresponding terminal of the first diode.

In one aspect of the disclosure, a method for providing ESD protection includes coupling a first diode between a first power source of an IC device and an I/O pad of the IC device, the first diode being configured to divert a first portion of an ESD current that is conducted through the I/O pad, coupling a second diode between a second power source of the IC device and the I/O pad, the second diode being configured to divert a second portion of the ESD current, and coupling the second diode to the first diode through a resistive element, wherein the second diode is coupled to the I/O pad through the resistive element. The first power source may supply a driver circuit coupled to the I/O pad. The second power source may supply one or more core circuits of the IC device.

In certain examples, the resistive element includes an interconnect that couples a terminal of the second diode to a terminal of the first diode and that has a resistance that produces a voltage differential between the terminal of the second diode and the corresponding terminal of the first diode during an ESD event. The resistive element may comprise a parasitic resistance.

In certain examples, the driver circuit is configured to receive a controlling input from the one or more core circuits. In one example, the driver circuit may include a transistor that has a gate coupled to an output of a pre-driver circuit that receives power from the second power source. A drain of the transistor may be coupled to the I/O pad.

In one example, the ESD current enters the integrated circuit device through the I/O pad during an ESD event. The first diode and the second diode may be reverse biased before the ESD current enters the integrated circuit device.

In one example, the driver circuit operates at a voltage level greater than a voltage level at which the one or more core circuits operate.

In one example, a first clamping circuit is coupled between the first power source and a ground reference of the IC device and a second clamping circuit is coupled between the second power source and the ground reference. The first clamping circuit may be configured to limit variations in voltage difference between the first power source and the ground reference. The second clamping circuit may be configured to limit variations in voltage difference between the second power source and the ground reference. In one example, the interface circuit comprises a Low-Power Double Data Rate Synchronous Dynamic Random Access Memory (LPDDR SDRAM) interface circuit.

In certain examples, the driver circuit has two PMOS pull-up transistors coupled in series between the first power source and the I/O pad. In some examples, the driver circuit has a plurality of serially-coupled NMOS transistors coupled to the I/O pad.

In some examples, the first diode is coupled to a ground reference of the IC device through a third diode. The third diode has a first terminal coupled to the ground reference and a second terminal coupled to the I/O pad. The second diode may be coupled to the ground reference through a fourth diode. The fourth diode may have a first terminal coupled to the ground reference and a second terminal coupled to the I/O pad through a resistive element that is coupled to a corresponding terminal of the third diode.

BRIEF DESCRIPTION OF THE DRAWINGS

FIG. 7 is a flow diagram illustrating an example of a method for providing ESD protection in accordance with certain aspects disclosed herein.

DETAILED DESCRIPTION

Figure 1:
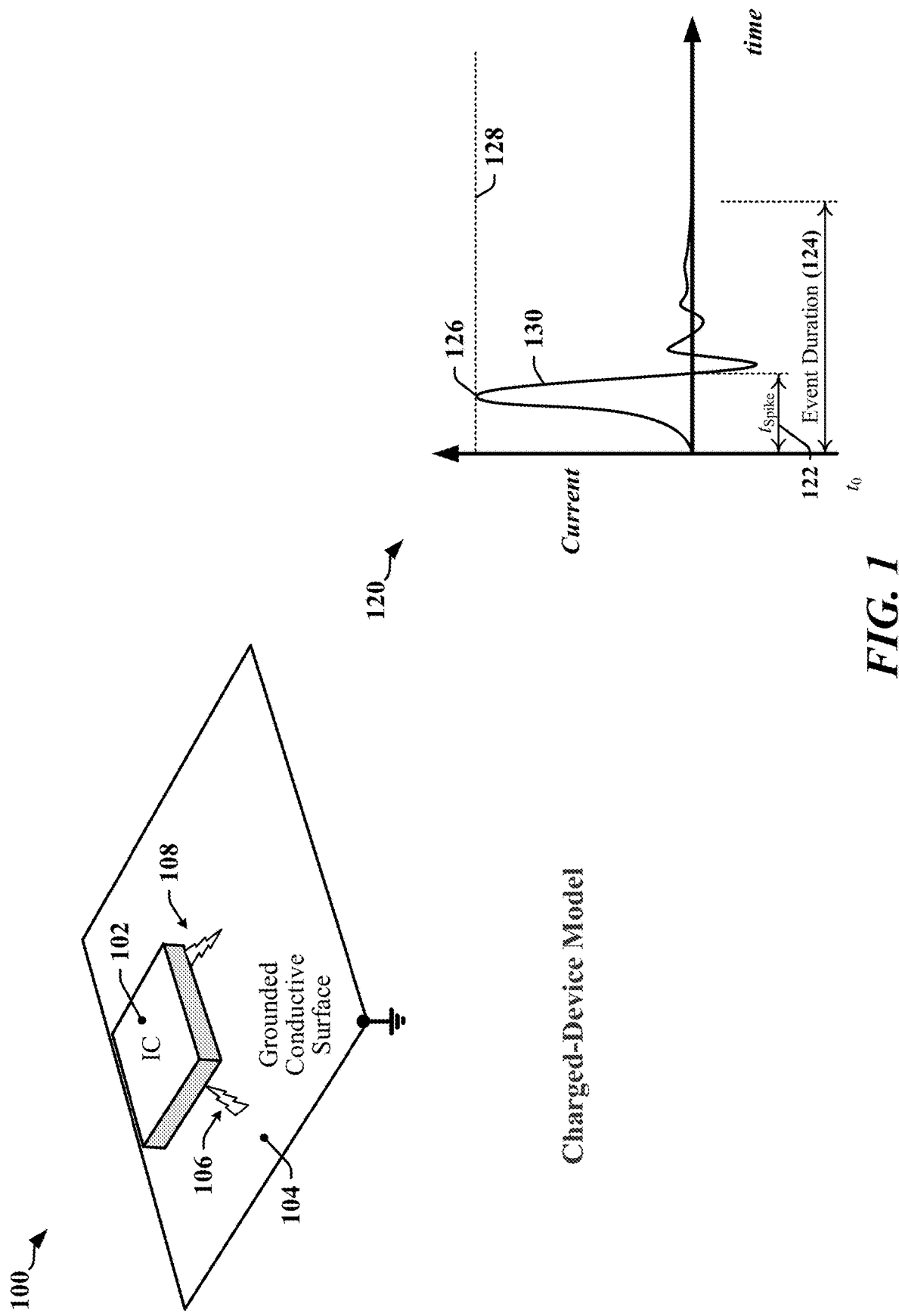
FIG. 1 illustrates an example of ESD event.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and operating frequencies. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

In many implementations, an IC device may include and/or distinguish between internal core circuits and peripheral or I/O circuits. The internal core circuits may be included in a section of the IC that may be referred to simply as a "core" that performs certain functions including storing data (memory), managing stored data, performing certain logic functions, processing-specific functions, cryptography, image processing and so on. More than one section of an IC may be defined as a core. In many examples, the devices and/or circuits in a core may be configurable to operate at the highest possible operating frequency enabled by the process technology. In many examples, the operating frequency of circuits in a core may be constrained by a power budget and the operating frequency of some core circuits may be configured to obtain fastest operation within the power budget. Lower power consumption in high speed circuits can be achieved by reducing the operating voltage of the core, and process technologies have been evolving to support ever-lower core operating voltages.

The functions of the peripheral or I/O circuits in an IC include the control and driving of data communication and general purpose I/O (GPIO) signals at higher voltage levels than the voltage level used to operate core devices and circuits. Peripheral and/or I/O circuits may be required to support higher amperage current flows into and out of the IC device. In some examples, operating voltages, currents and operating frequencies are mandated for the peripheral or I/O circuits by industry or proprietary standards. The differences between operating characteristics of the core and the peripheral or I/O circuits may increase with every generation of process technology.

An IC device typically receives power from an external power supply. Examples of external power supplies include batteries, solar cells or solar panels, switching power supplies and other types of power converters. The external power supply may provide power at different voltage levels, where the voltage levels are measured with respect to a ground reference. In one example, the ground reference may be designated to be a zero-volt level. Multiple rails may be provided to carry current to or from the power supply. Each rail provides a low resistance path for current flows and each rail may be implemented using one or more wires, connectors, interconnects, traces on a circuit board or the like. The IC device may be coupled to two or more of the rails and may extend these coupled rails internally using low-impedance interconnects or conductive planes with the IC structure. The internal rails conduct current to the various sections of the IC device at a defined voltage level.

In some examples, the internal rails may be referred to as internal power sources or power sources, although the rails may serve as conduits for external power sources. In some examples, internal power sources may include internal rails that are driven by power conditioning circuits, power conversion circuits or circuits that step or step down voltage levels for use within the IC device.

In some examples, the internal rails may be labeled according to usage. In some examples, the ground reference of an IC device or of a section of an IC device may be labeled Voltage-Source-Source ($V_{ss}$), and non-zero voltage rails may be labeled Voltage-Drain-Drain ($V_{dd}$). In many examples, the IC may provide multiple $V_{dd}$ rails, labeled $V_{dd}1, V_{dd}2, V_{dd}3, \ldots V_{dd}X$, etc. The ground reference may provide a return path for currents flowing through the IC device.

In some instances, different voltage domains may be identified in an IC device. Each voltage domain may include multiple devices or circuits that receive power at a common voltage level. In one example, a first voltage domain may include devices that are coupled between $V_{ss}$ and $V_{dd}1$, a second voltage domain may include devices that are coupled between $V_{ss}$ and $V_{dd}2$, a third voltage domain may include devices that are coupled between $V_{ss}$ and $V_{dd}3$, and so on. A voltage domain may also be referred to as a power domain. The evolution of process technology and the corresponding evolution of transistor technology has led to decreased gate oxide thickness and lower operating voltages in some types of circuits.

Certain aspects of this disclosure relate to input/out (I/O) circuits in IC devices, including I/O circuits included or controlled by circuits that provide an interface between core circuits and peripherals. Peripherals and core circuits may be implemented using the same or different process technologies and may operate at the same or different voltages. In some examples, an interface may support low-speed, higher-voltage peripherals. In some examples, an interface may support high-speed, lower-voltage peripherals. In some examples, an interface may connect to a communication bus that operates at frequencies and voltages defined by industry standards and that imposes current and power requirements on I/O circuits.

In one example, certain aspects of the disclosure are applicable to I/O circuits that provide an interface between core circuits and memory devices. Many mobile devices employ Synchronous Dynamic Random Access Memory (SDRAM), including Low-Power Double Data Rate SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies may employ lower voltage levels in the core of an SoC or memory device to mitigate for increased power associated with the higher operating frequencies. Voltage levels for input/out (I/O) signals may be higher than core or memory voltage levels and stacked transistors may be employed in I/O interface circuits to provide output drivers that can span the difference between core or memory voltage levels and voltage levels of I/O pads.

In some mobile, battery-powered applications, multiple voltage rails may be used to conserve power and reduce heat generation. In one example, an SoC output driver may include a voltage rail shared between the output driver and one or more peripheral devices or circuits, and may include voltage rails used exclusively by core circuits or by peripheral devices or circuits.

Certain design enhancements implemented to support higher operating frequencies while minimizing power consumption and dissipation may increase susceptibility to ESD events. In one example, the reduction in gate oxide thickness reduces the maximum gate-drain, gate-source voltage that can be withstood by the device during an ESD event. In another example, the use of multiple voltage rails or domains for power saving purposes can leave a device susceptible to ESD-generated damage to lower voltage gates when higher voltages are used for interfacing with external devices, and lower voltages are provided to operate core circuits. In the latter example, a stack of low threshold voltage transistors may be used to provide I/O drivers that switch within voltage ranges greater than core voltage ranges.

Electrostatic discharge (ESD) events can generate voltages or currents within an IC device that exceed rated operating parameters, including rated operating voltage. Rated operating voltage may lie within a nominal operating range of voltage levels defined for certain devices, circuits or interface pads. Without adequate protection, circuits can be damaged near interface pads facilitate I/O or other sources or entry points of the ESD events. ESD events may occur due to some combination of grounding failures, handling and accumulation of static charge at a surface or point of contact near the IC device. There is a need for enhancement of ESD protection circuits that can be implemented without compromising high-speed performance aspects of I/O driver circuits.

Certain aspects of this disclosure are described in relation to a charged-device model (CDM) characterization of ESD events. The CDM relates to an ESD event that occurs when a chip, chip carrier or package that includes an IC device contacts a low impedance electrical path. A sudden discharge of energy can occur if the chip, chip carrier or package is carrying an accumulated electrostatic charge, causing a high-voltage pulse or spike at I/O pads of the IC device. The voltage observable at one or more I/O pads may exceed rated tolerances for transistors in the IC device and can cause breakdown or other damage to transistor gates and other features of the IC device if adequate ESD protection is not provided.

FIG. 1 illustrates an example of an ESD event 100 that may be characterized by a CDM.

The ESD event 100 occurs as an IC device 102 is placed on a metal or other conductive surface 104. In some examples, this type of ESD event 100 may occur at a manufacturing or assembly facility when IC devices on chips, chip carriers or packages are accumulated, assembled or sorted before being placed and bonded or soldered to a circuit board. In some examples, this type of ESD event 100 may occur at a manufacturing facility when IC devices 102 are picked up by a robot and placed on a circuit board or in a shipment package, where the robot may serve as the conductive surface 104. As the IC device 102 is placed on the conductive surface 104, accumulated charge in the IC device 102 may be discharged to the conductive surface 104 through one or more potential gradients 106, 108. Discharge may occur before or after I/O pins or pads are directly coupled to the conductive surface 104.

The graph 120 illustrates an example of a type of ESD event 100 as characterized by a CDM. In this example, a high percentage of the electrostatic energy accumulated in the IC device 102 is discharged over a short period of time 122 in an initial pulse or spike 130. In one example, the ESD event 100 may have a duration 124 that lasts for approximately 5 nanoseconds with the initial spike 130 ending after approximately 1 nanosecond. In some instances, the discharge may result in a first peak 126 at a current level 128 of 4.7 amps or more. The current spike flowing through an I/O pad of the IC device 102 may cause a correspondent spike in voltage in the interface circuits of the IC device 102.

Current ESD protection schemes employed to protect output drivers typically include diodes connected between an interface pad and output power supply rails and may include a clamping circuit with a discharge path that can carry the ESD current during an ESD event.

Figure 2:
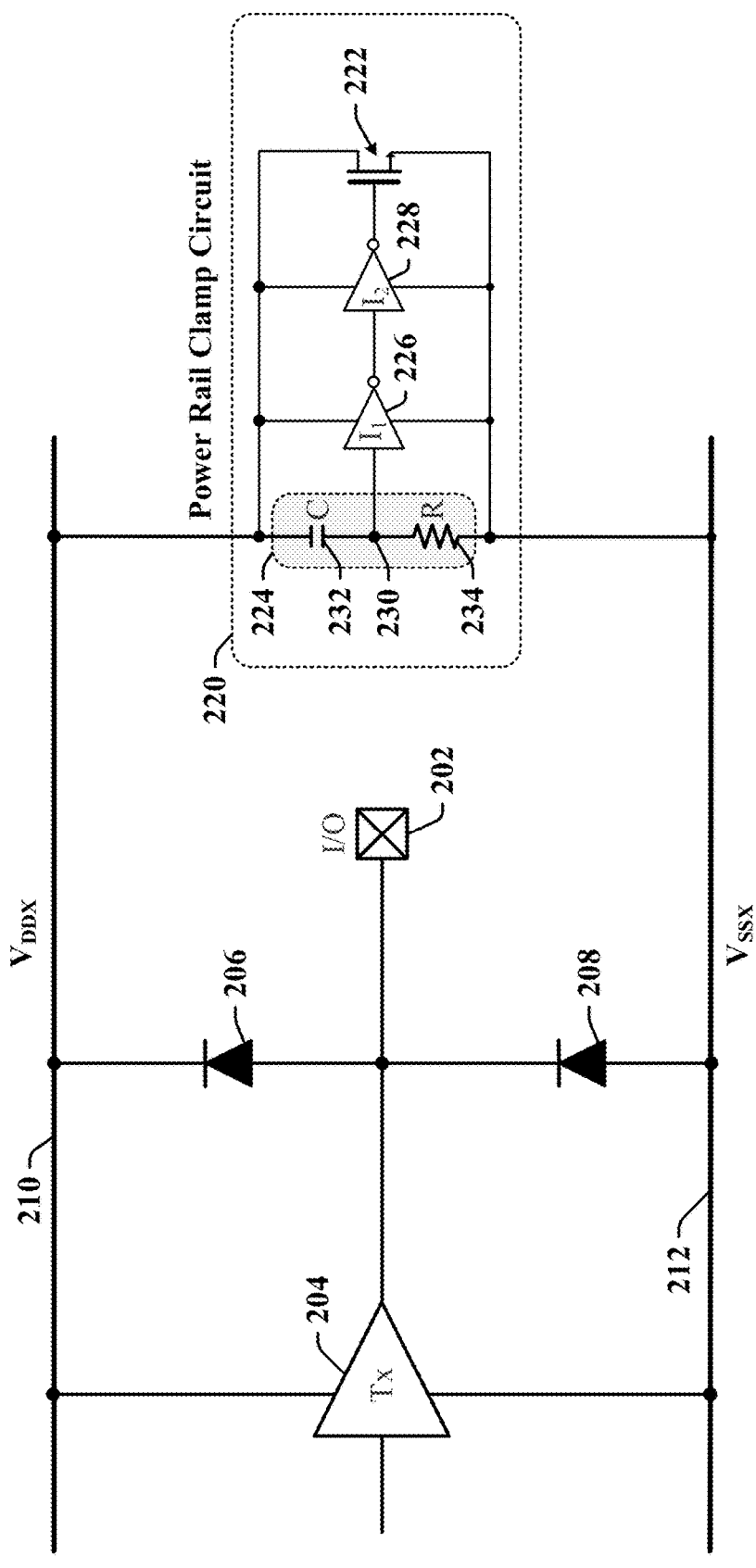
FIG. 2 illustrates an example of an interface circuit that provides ESD protection in an IC device.

FIG. 2 illustrates an example of an interface circuit 200 that provides ESD protection in an IC device. In one example, the interface circuit 200 may be incorporated in an IC, SoC or other device communicatively coupled to an LPDDR SDRAM. The interface circuit 200 includes a driver 204 that can be used to transmit signals through an I/O pad 202 of the IC device. The driver 204 may be configured to provide an output that switches between a power rail ($V_{DDX}$ 210) and a ground reference ($V_{SSX}$ 212). ESD protection is provided by a pair of diodes 206, 208. A first diode 206 is coupled to $V_{DDX}$ 210 and to the I/O pad 202 and is reverse biased when the voltage of the I/O pad 202 remains below $V_{DDX}$ 210. A second diode 208 is coupled to $V_{SSX}$ 212 and to the I/O pad 202 and is reverse biased when the voltage of the I/O pad 202 remains above $V_{SSX}$ 212. An ESD event may cause a current surge that is conducted through the I/O pad 202 and through one or more interconnects coupled to the I/O pad 202, including interconnects that couple the I/O pad 202 and the driver 204. While the interconnects have a low resistance, the voltage of the I/O pad 202 relative to $V_{DDX}$ 210 and/or $V_{SSX}$ 212 and can significantly change when conducting a multi-amp ESD surge current. The change in voltage may be sufficient to forward bias one of the diodes 206, 208, thereby enabling the ESD surge current to be diverted to $V_{DDX}$ 210 or $V_{SSX}$ 212 away from the driver 204 and other circuits of the IC device.

The diversion of the ESD surge current to $V_{DDX}$ 210 or $V_{SSX}$ 212 can increase the voltage difference between $V_{DDX}$ 210 and $V_{SSX}$ 212, which can stress or damage devices in the interface circuit 200 if left unchecked. The illustrated interface circuit 200 includes a power rail clamping circuit 220 that is coupled between $V_{DDX}$ 210 and $V_{SSX}$ 212. The power rail clamping circuit 220 includes an N-type metal-oxide-semiconductor (NMOS) transistor 222 that is biased by a serial RC network 224. The RC network 224 has a capacitor 232 coupled in series with a resistor 234. In the illustrated example, the serial RC network 224 is coupled between power supply $V_{DDX}$ 210 and the ground reference $V_{SSX}$ 212. A node 230 coupling the capacitor 232 and the resistor 234 is coupled to the gate of the transistor 222 through a buffer amplifier arrangement including first and second series-connected inverters 226, 228. The power rail clamping circuit 220 ensures a low impedance path from $V_{DDX}$ 210 to $V_{SSX}$ 212 when an ESD pulse applied to the I/O pad 202 causes the voltage difference between $V_{DDX}$ 210 and $V_{SSX}$ 212 to increase.

In one example, a rising voltage on $V_{DDX}$ 210 is coupled through the capacitor 232 to the input of the first inverter 226 forcing its output low. In response, the output of the second inverter 228 goes high turning on the transistor 222. When the transistor 222 turns on, the ESD discharge current can begin to flow between $V_{DDX}$ 210 and $V_{SSX}$ 212.

Figure 3:
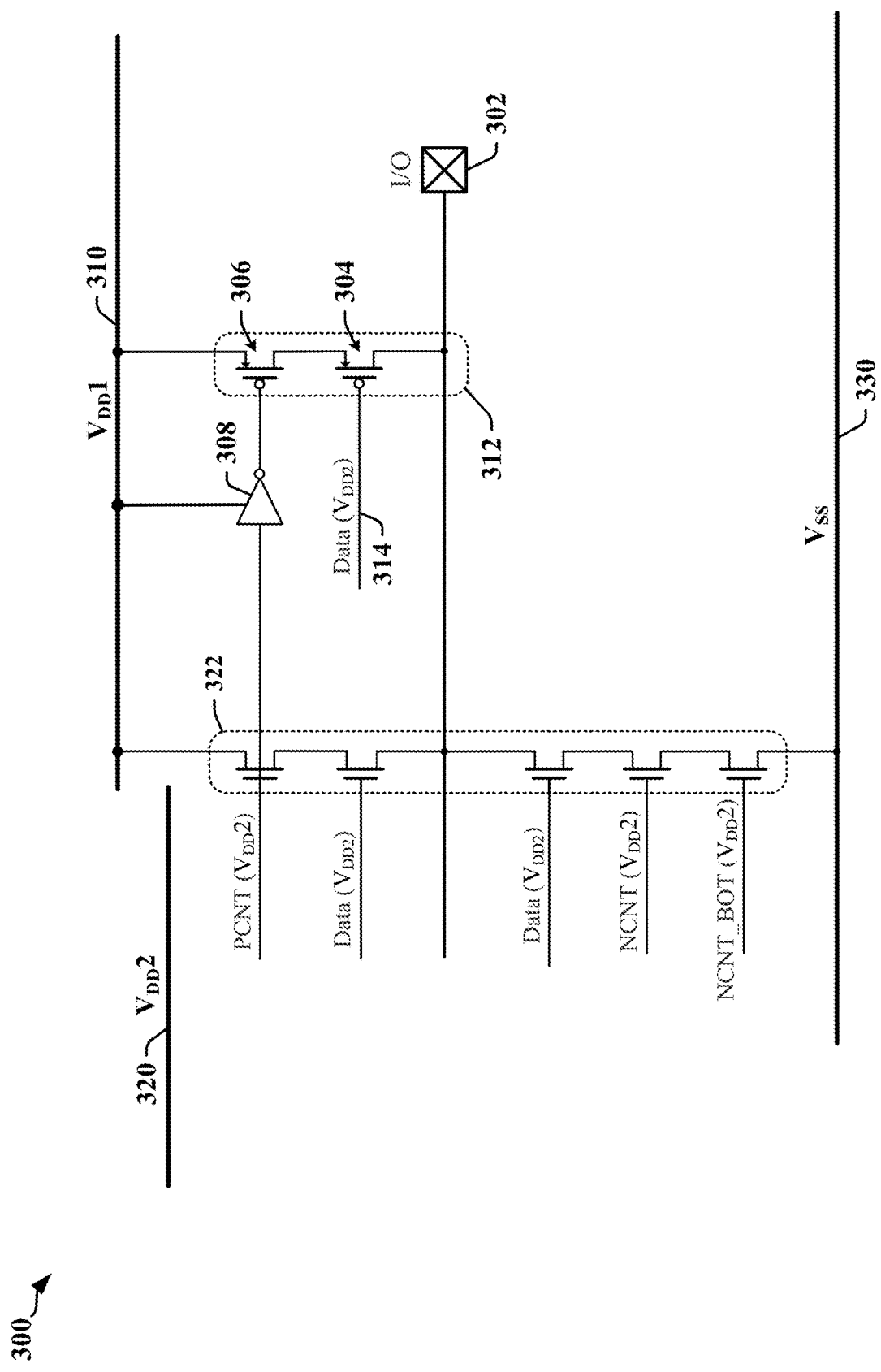
FIG. 3 illustrates an interface circuit in an IC device that provides power at multiple voltage levels.

FIG. 3 illustrates an example of an interface circuit 300 in an LPDDR SDRAM interface circuit that illustrates the use of multiple voltage rails to conserve power and reduce heat generation in mobile, battery-powered operations. The voltage rails are used to distribute power within the IC device and each rail may provide a voltage level that is defined by process technology and that may be configured to comply with industry standards. One or more voltage rails may provide power at an internal scalable operating voltage that can optimize power consumption and operating frequency within the IC device.

In the illustrated example, the interface circuit 300 is provided in an LPDDR5 device and uses thin-gate transistors for output drivers to support higher operating frequencies. The interface circuit 300 includes a driver circuit 312 that is configured to drive an I/O pad 302 to a first voltage rail ($V_{DD}1$ 310). The driver circuit 312 has two P-type metal-oxide-semiconductor (PMOS) transistors 304, 306. A first PMOS transistor 304 may receive a data signal 314 that is generated in a lower-voltage domain. In the illustrated example, the data signal 314 is generated by a circuit in a voltage domain powered by a second voltage rail ($V_{DD}2$ 320) that is provided at a lower voltage than $V_{DD}1$ 310. A second PMOS transistor 306 is provided to ensure that the source-drain voltage across the first PMOS transistor 304 remains within specified limits. The gate of the second PMOS transistor 306 is driven by a pre-driver 308 operated in the voltage domain associated with $V_{DD}1$ 310. The stacked low-voltage transistors 322 may be operated in a single voltage domain and configured, for example, to drive the I/O pad 302 between $V_{DD}2$ 320 and the ground reference ($V_{SS}$ 330). In some examples, the stacked low-voltage transistors 322 include a plurality of NMOS transistors, or a combination of PMOS and NMOS transistors (not illustrated).

Figure 4:
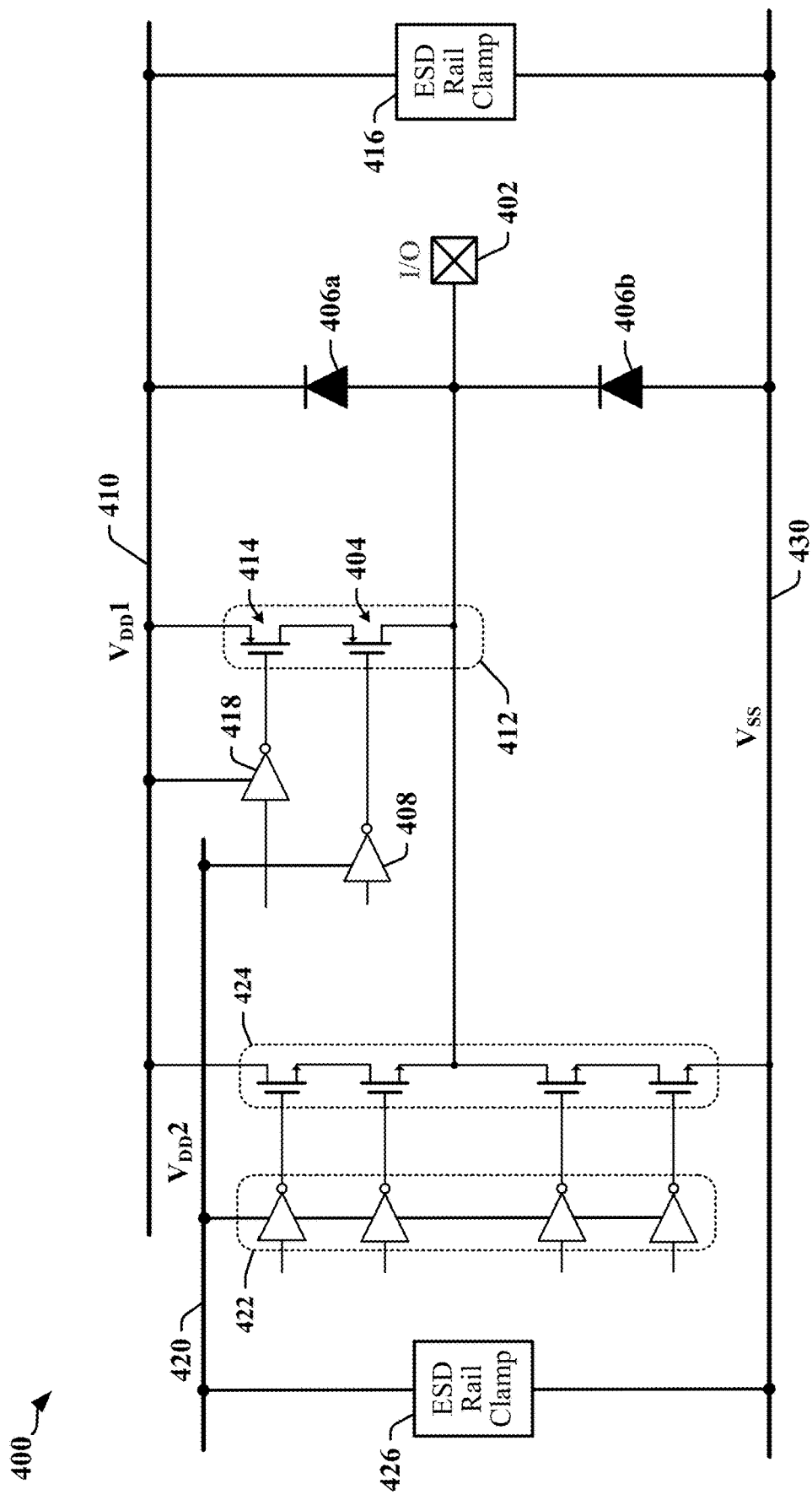
FIG. 4 illustrates an example of an interface circuit in an IC device that includes ESD protection circuits.

FIG. 4 illustrates an example of an interface circuit 400 in an IC device that includes ESD protection circuits. In the illustrated example, the interface circuit 400 includes a driver circuit 412 that is configured to drive an I/O pad 402 to a first voltage rail ($V_{DD}1$ 410). The driver circuit 412 includes two PMOS transistors (the PMOS transistors 404, 414) that may be individually rated for operation at voltages less than $V_{DD}1 - V_{SS}$. The PMOS transistors 404, 414 may be driven by respective pre-drivers 408, 418 that may be switched by one or more signals generated in a lower-voltage domain. In the illustrated example, one pre-driver 408 is powered by a second voltage rail ($V_{DD}2$ 420) that is provided at a lower voltage than $V_{DD}1$ 410. Four NMOS transistors 424 powered by $V_{DD}1$ 410 are configured to drive the I/O pad 402.

ESD protection of devices coupled to the I/O pad 402 is nominally provided by a pair of diodes 406a, 406b that are configured to shunt ESD surge currents to $V_{DD}1$ 410 or $V_{SS}$ 430, respectively. A first diode 406a is coupled to $V_{DD}1$ 410 and to the I/O pad 402 and is reverse biased when the voltage of the I/O pad 402 remains below $V_{DD}1$ 410. A second diode 406b is coupled to $V_{SS}$ 430 and to the I/O pad 402 and is reverse biased when the voltage of the I/O pad 402 remains above $V_{SS}$ 430. An ESD event may cause a current surge through the I/O pad 402 and one or more interconnects between the I/O pad 402 and the diodes 406a, 406b. The interconnects have a low resistance that can significantly change the voltage of the I/O pad 402 when conducting a multi-amp ESD surge current. The change in voltage may be sufficient to forward bias one of the diodes 406a, 406b, thereby enabling the ESD surge current to be diverted to $V_{DD}1$ 410 or $V_{SS}$ 430 away from the PMOS transistors 404, 414, the NMOS transistors 424 and other circuits of the IC device.

The gate of the PMOS transistor 404 coupled to the I/O pad 402 is driven by a cross domain signal provided by the low-voltage pre-driver 408, which receives power from $V_{DD}2$ 420. Low-voltage NMOS transistors 424 receive power from $V_{DD}1$ 410 and their corresponding pre-drivers 422 receive power from $V_{DD}2$ 420. A first ESD rail clamp 416 limits voltage differentials between $V_{DD}1$ 410 and $V_{SS}$ 430 during surges. A second ESD rail clamp 426 limits voltage differentials between $V_{DD}2$ 420 and $V_{SS}$ 430 during surges. In some examples, $V_{DD}1$ 410 may represent a 3.3 volt or 1.8 volt supply. In some examples, $V_{DD}2$ 420 may represent a 1.8 volt or 1.2 volt supply. In some instances, $V_{DD}2$ 420 represents a scalable internal rail that supplies power to certain circuits at a voltage level configured to optimize operating frequency and power consumption.

In some examples, increases in the voltage above at the I/O pad 402 may be limited by the operation of diode 406a. Accordingly, voltage increases at the drain of the PMOS transistor 404 may be limited to a voltage that is not significantly greater than $V_{DD}1 + V_f$, where $V_f$ represents the forward bias voltage of diode 406a. Similarly, the expected fall of voltage at the drains of the PMOS transistor 404 can be limited to $V_{SS} - V_f$, due to the operation of diode 406b.

Figure 5:
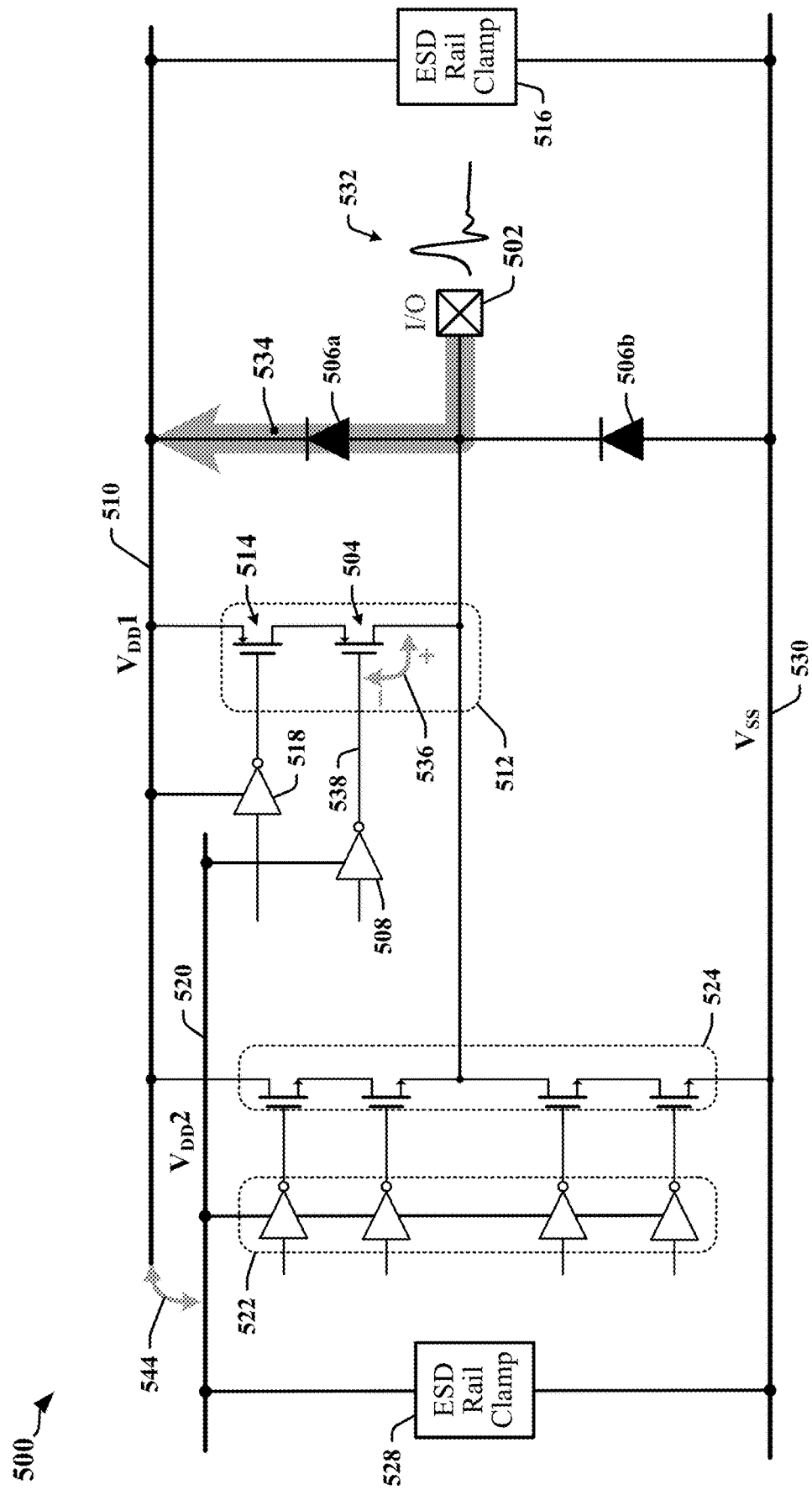
FIG. 5 illustrates the effect of an ESD event on an interface circuit in an IC device that includes ESD protection circuits.

FIG. 5 illustrates the effect of an ESD event 532 on an interface circuit 500 in an IC device that includes ESD protection circuits. ESD protection of devices coupled to the I/O pad 502 is nominally provided by the ESD protection diodes 506a, 506b that are configured to shunt ESD surge currents to $V_{DD}1$ 510 or $V_{SS}$ 530, respectively. ESD currents are expected to be diverted to $V_{DD}1$ 510 or $V_{SS}$ 530 through one of the ESD protection diodes 506a or 506b when the ESD protection diode 506a or 506b becomes forward biased during the ESD event 532. The ESD event 532 may be simulated using a negative CDM stress test, in which an ESD current 534 enters the I/O pad 502. The ESD current 534 flowing through the I/O pad 502 may produce a voltage waveform that corresponds to that of the ESD event 100 illustrated in FIG. 1, in which the first peak 126 is positive and increases the voltage of the I/O pad 502 above the level of $V_{DD}1$ 510 voltage rail of the IC device. The ESD current 534 is expected to be diverted through the ESD protection diode 506a to the $V_{DD}1$ 510 voltage rail during negative CDM tests on the I/O pad 502.

The interface circuit 500 may be similar in certain respects to the interface circuit 300 illustrated in FIG. 3. The interface circuit 500 includes a driver circuit 512 that is configured to drive an I/O pad 502 to a first voltage rail ($V_{DD}1$ 510). The driver circuit 512 has two PMOS transistors 504, 514 that may be individually rated for operation at voltages less than $V_{DD}1 - V_{SS}$. The PMOS transistors 504, 514 may be driven by respective pre-drivers 508, 518 that may be switched by one or more signals generated in a lower-voltage domain. In the illustrated example, one pre-driver 508 is powered by a second voltage rail ($V_{DD}2$ 520) that is provided at a lower voltage level than $V_{DD}1$ 510. Four NMOS transistors 524 receive power from $V_{DD}1$ 510 and are configured to drive the I/O pad 502 in response to signals received from a low-voltage domain. The gates of the four NMOS transistors 524 are driven by respective pre-drivers 522 that receive power from $V_{DD}2$ 520.

Increases in voltage level of $V_{DD}1$ 510 caused by shunting the ESD current to $V_{DD}1$ 510 (or to $V_{SS}$ 530) may be mitigated through an ESD rail clamping circuit 516. In one example, a simulation of the ESD event 532 may be configured to produce a 250 Volt peak voltage at the I/O pad 502. The ESD protection diode 506a coupled to $V_{DD}1$ 510 becomes forward biased when the voltage at the I/O pad 502 exceeds $V_{DD}1 + V_f$, where $V_f$ represents the forward bias voltage of the ESD protection diode 506a. The forward-biased ESD protection diode 506a diverts the ESD current 534 generated by the ESD event 532 to $V_{DD}1$ 510.

The ESD rail clamping circuit 516 is configured to limit variations in the difference between the high-voltage rail and ground (i.e., $V_{DD}1 - V_{SS}$). Accordingly, the rise of the voltage at the drain of the PMOS transistor 504 can be expected to be limited to a voltage that is not significantly greater than $V_{DD}1 + V_f$, with respect to $V_{SS}$ 530. In the low-voltage domain, an ESD rail clamping circuit 528 may be configured to limit variations in the difference between the low-voltage rail and ground (i.e., $V_{DD}2 - V_{SS}$).

Conventional ESD protection circuits may protect the I/O devices operating in higher voltage domains but can leave the interface between low voltage and high voltage domains susceptible to ESD-related damage. For example, damage may occur to the PMOS transistor 504, which has a gate driven by cross-voltage domain signals. In the illustrated example, the gate of the PMOS transistor 504 coupled to the I/O pad 502 is driven by a cross domain signal provided by the low-voltage pre-driver 508, which receives power from $V_{DD}2$ 520. In some instances, overvoltage conditions occurring between the drain and gate of a PMOS transistor 504 during the ESD event 532 can damage the PMOS transistor 504. A sufficiently high difference voltage 536 (|Vgd|) between the drain and gate of the PMOS transistor 504 can cause physical breakdown of the transistor gate.

The difference voltage 536 may reach a damaging overvoltage level during the ESD event 532 due to certain aspects of a cross-domain signal 538 that drives the gate of the PMOS transistor 504. For example, the ESD event 532 may cause a sudden increase in voltage of the power supply rail ($V_{DD}1$ 510) that defines the voltage domain of the PMOS transistor 504. The increase in voltage of $V_{DD}1$ 510 may not be closely tracked by changes in the power supply rail ($V_{DD}2$ 520) that defines the voltage domain of a pre-driver 508 that provides the cross-domain signal 538 to the gate of the PMOS transistor 504. A resultant increased voltage difference 544 between $V_{DD}1$ 510 and $V_{DD}2$ 520 may propagate as an increase in relative voltage between the gate and the drain of the PMOS transistor 504. In one example, the absolute voltage of the cross-domain signal 538 may remain constant for a short period of time while the voltage at the drain of the PMOS transistor 504 follows the voltage of the I/O pad 502 during the ESD event 532, thereby causing a change in the difference voltage 536 sufficient to damage the PMOS transistor 504. Delays in the operation of the ESD rail clamping circuits 516, 528 may cause the increased voltage difference 544 between $V_{DD}1$ 510 and $V_{DD}2$ 520.

In one example, application of a 250 Volt ESD peak voltage to the I/O pad 502 may cause an overvoltage condition between the drain and gate of the PMOS transistor 504 regardless of the magnitude and polarity of the voltage difference between $V_{DD}1$ 510 and $V_{DD}2$ 520. The overvoltage condition can occur whether $V_{DD}1 > V_{DD}2$, $V_{DD}1 < V_{DD}2$, or $V_{DD}1 = V_{DD}2$. In some instances, the overvoltage condition can occur due to AC decoupling of one or more power or ground rails are AC decoupled between sections of an IC device. The ESD event 532 is described in relation to an interface circuit that is constructed from double-stacked PMOS transistors, although the ESD-induced overvoltage conditions may affect interface circuit constructed from NMOS transistors, or using single, triple or more stacks of transistors.

Certain aspects of this disclosure provide ESD protection circuits that can reduce or eliminate overvoltage conditions resulting from interactions between an ESD event and multiple voltage domains or voltage rails. In some examples, additional ESD protection diodes may be deployed between additional, or low-voltage rails and the I/O pad. The additional ESD protection diodes may be configured such that ESD events cause voltage increases in low-voltage rails similar in magnitude to voltage increases in high-voltage rails used by the interface circuits.

Figure 6:
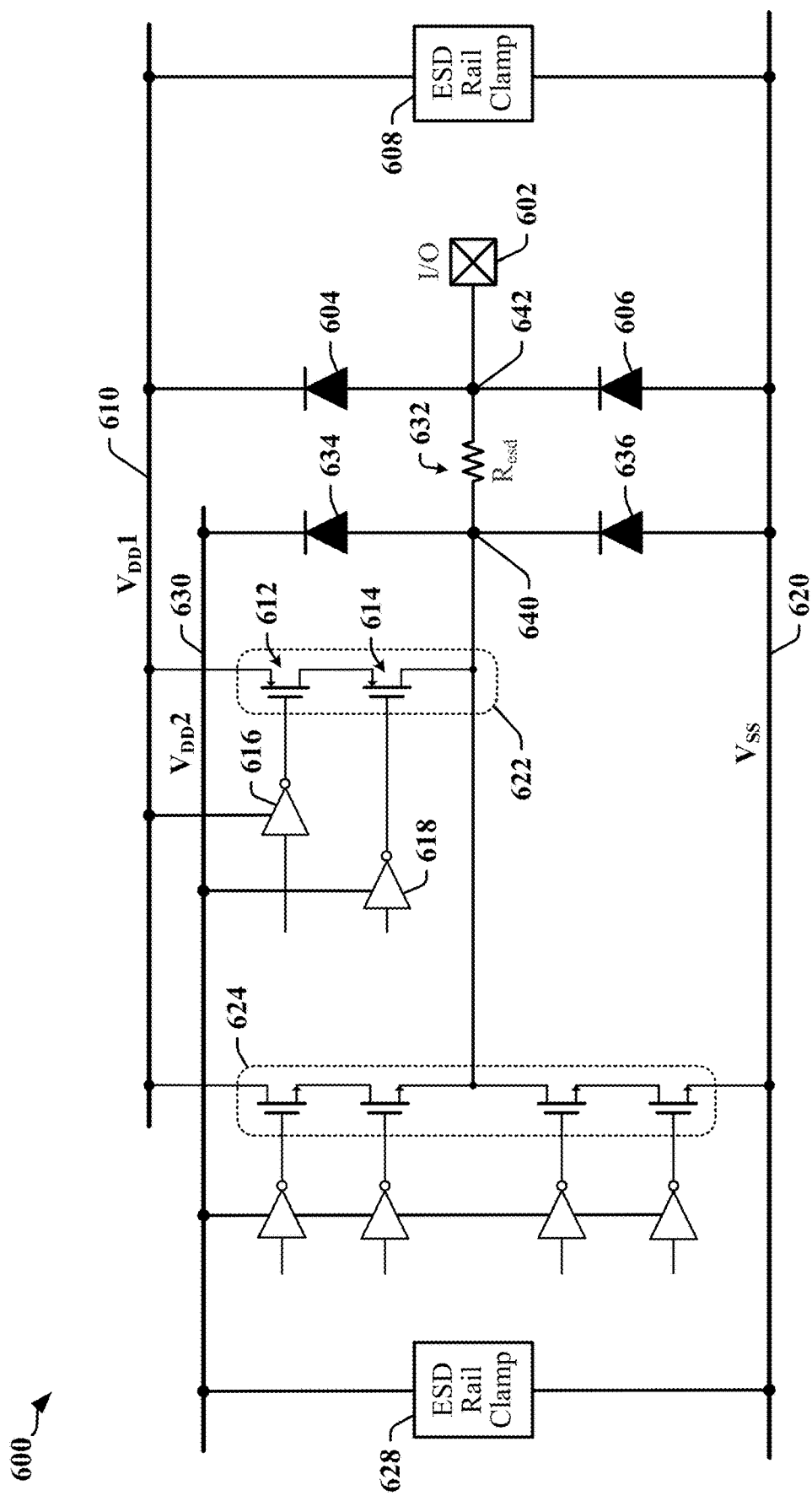
FIG. 6 illustrates an example ESD protection circuits in an interface circuit that is associated with multiple voltage rails in accordance with certain aspects of this disclosure.

FIG. 6 illustrates an example of an interface circuit 600 in an IC device that includes ESD protection diodes for multiple voltage rails. In one example, a primary ESD protection diode 604 is coupled between an I/O pad 602 and the I/O driver supply rail ($V_{DD}1$ 610) and a secondary ESD protection diode 634 is coupled between the I/O pad 602 and the pre-driver supply rail ($V_{DD}2$ 630). In some implementations, the primary ESD protection diode 604 is coupled to the I/O pad 602 through a primary node 642. The secondary ESD protection diode 634 may be coupled to a secondary node 640 that is interconnected with the primary node 642 to provide the coupling between the secondary ESD protection diode 634 and the I/O pad 602.

The interface circuit 600 may be similar in certain respects to the interface circuit 300 illustrated in FIG. 3 and/or the interface circuit 400 illustrated in FIG. 4. In the illustrated example, the interface circuit 600 includes a driver circuit 622 that is configured to drive an I/O pad 602 to a first voltage rail ($V_{DD}1$ 610). The driver circuit 622 has two PMOS transistors 612, 614 that may be individually rated for operation at voltages less than $V_{DD}1 - V_{SS}$, where $V_{SS}$ corresponds to the voltage of the ground reference (here, $V_{SS}$ 620). The PMOS transistors 612, 614 may be driven by respective pre-drivers 616, 618 that may be switched by one or more signals generated in a lower-voltage domain. In the illustrated example, one pre-driver 618 is powered by $V_{DD}2$ 630 that is provided at a lower voltage level than $V_{DD}1$ 610. In some examples, the interface circuit 600 includes one or more sets of serially-coupled NMOS transistors that are configured to drive the I/O pad 602 from the low-voltage domain. In the illustrated example, four transistors are provided in a set of serially-coupled NMOS transistors 624. The number of transistors provided in the set of serially-coupled NMOS transistors 624 may be determined by the operating voltage of the transistors, and the voltage levels of $V_{DD}1$ 610 and $V_{DD}2$ 630 relative to $V_{SS}$ 620.

Primary ESD protection diodes 604, 606 are coupled at the I/O pad 602 and provide protection for transistors and circuits powered by $V_{DD}1$ 610. One ESD protection diode 604 is coupled to $V_{DD}1$ 610, and the other ESD protection diode 606 is coupled to $V_{SS}$ 620. The primary ESD protection diodes 604, 606 are configured to shunt ESD surge currents to $V_{DD}1$ 610 or $V_{SS}$ 620, respectively.

Secondary ESD protection diodes 634, 636 are coupled to the I/O pad 602 and provide protection for transistors and circuits powered by $V_{DD}2$ 630 or that are coupled to cross-domain signals. One ESD protection diode 634 is coupled to $V_{DD}2$ 630, and the other ESD protection diode 636 is coupled to $V_{SS}$ 620. The secondary ESD protection diodes 634, 636 are configured to shunt ESD surge currents to $V_{DD}2$ 630 or $V_{SS}$ 620, respectively.

In some examples, the secondary ESD protection diodes 634, 636 may be physically smaller than the primary ESD protection diodes 604, 606 or may be configured for lower maximum current flow when forward-biased. Interconnect routing may be used to implement a greater resistance between the I/O pad 602 and the secondary ESD protection diodes 634, 636, compared to that of the resistance of the coupling between the I/O pad 602 and the primary ESD protection diodes 604, 606. The difference in resistance is represented in FIG. 6 as a series resistor (the ESD resistor 632) connecting the ESD protection diodes 604, 606, 634, 636. The physical interconnects that couple the I/O pad 602 to the ESD protection diodes 604, 606, 634, 636 have a finite resistance that is determined by the structure (cross-section) of the interconnects, resistivity, length of interconnects, parasitic resistance and other factors such as skin effects. Skin effect occurs in high frequency signals when current density is concentrated at the surface of a conductor or interconnect.

In some examples, the ESD resistor 632 represents the resistance of a physical interconnect between the primary node 642 that couples the primary ESD protection diodes 604, 606 and the secondary node 640 that couples the secondary ESD protection diodes 634, 636. In the illustrated example, the secondary ESD protection diodes 634, 636 may be coupled to the I/O pad 602 through the secondary node 640, the ESD resistor 632, and the primary node 642. An ESD resistor 632 with large resistance may enable the use of physically smaller secondary ESD protection diodes 634, 636 and can provide other benefits. The ESD resistor 632 may introduce a significant voltage drop when an ESD surge current is passed through the ESD resistor 632 and the ESD resistor 632 can reduce the voltage surge on the drain voltage of the PMOS transistor 614 during ESD events with respect to the voltage increase caused on $V_{DD}1$ 610. In some examples, the structure and length of interconnects may be configured to maximize the resistance of the ESD resistor 632. The ESD resistor 632 may represent or be provided as a sum of parasitic resistance of metal or polysilicon interconnects.

At least a portion of an ESD current passing through the I/O pad 602 may be diverted to $V_{DD}1$ 610 or $V_{SS}$ 620 through one of the first ESD protection diodes 604 or 606. A portion of the ESD current passing through the I/O pad 602 may be diverted to $V_{DD}2$ 630 or $V_{SS}$ 620 through one of the second ESD protection diodes 634 or 636 when the ESD protection diode 634 or 636 becomes forward biased during an ESD event. In one example, an ESD event may produce a 250 Volt peak voltage at the I/O pad 602. The ESD protection diode 604 coupled to $V_{DD}1$ 610 becomes forward biased when the voltage at the I/O pad 602 exceeds $V_{DD}1+V_f$, where $V_f$ represents the forward bias voltage of the ESD protection diode 604. The forward-biased ESD protection diode 604 diverts the ESD current generated by the ESD event to $V_{DD}1$ 610. The ESD protection diode 634 coupled to $V_{DD}2$ 630 becomes forward biased when the voltage at the I/O pad 602 exceeds $V_{DD}2+V_{Resd}+V_f$, where $V_{Resd}$ represents the voltage drop across the ESD resistor 632 and $V_f$ represents the forward bias voltage of the ESD protection diode 634. The forward-biased ESD protection diode 634 diverts the ESD current generated by the ESD event to $V_{DD}2$ 630.

Increases in voltage level of $V_{DD}1$ 610 caused by shunting the ESD current to $V_{DD}1$ 610 (or to $V_{SS}$ 620) may be mitigated through a first ESD rail clamping circuit 608. The first ESD rail clamping circuit 608 is configured to limit variations in the difference between the high-voltage rail and ground (i.e., $V_{DD}1-V_{SS}$). Increases in voltage level of $V_{DD}2$ 630 caused by shunting the ESD current to $V_{DD}2$ 630 (or to $V_{SS}$ 620) may be mitigated through a second ESD rail clamping circuit 628. The second ESD rail clamping circuit 628 is configured to limit variations in the difference between the high-voltage rail and ground (i.e., $V_{DD}2-V_{SS}$).

In one aspect of the disclosure, an apparatus has an IC device that provides a first power source, a second power source and one or more core circuits. In some examples, the first power source has a voltage level that is greater than the voltage level of the second power source. In one example, the first power source supplies power to an interface circuit that can be configured to enable the IC device to communicate with external devices. In one example, the interface circuit includes one or more drivers coupled through I/O pads to external signal wires or conductors. The IC device may be protected from ESD current surges by one or more ESD protection circuits.

In some implementations, an ESD protection circuit may be provided in an interface circuit and configured in accordance with certain aspects of this disclosure. The ESD protection circuit may have a first diode that is coupled between a first power source of an IC device and an I/O pad of the IC device. In one example, the first power source supplies a driver circuit coupled to the I/O pad. The ESD protection circuit may have a second diode coupled between a second power source of the IC device and the I/O pad. The second power source supplies one or more core circuits of the IC device.

In certain examples, the resistive element of the ESD protection circuit may include or be implemented using an interconnect that couples a terminal of the second diode to a terminal of the first diode. In some of these examples, the interconnect has a resistance that produces a voltage differential between the terminal of the second diode and the corresponding terminal of the first diode during an ESD event. The structure, length and route of the interconnect may be selected to generate the resistance that produces a desired voltage differential. In some examples, the resistive element comprises a parasitic resistance.

In some examples, the driver circuit is configured to receive a controlling input from the one or more core circuits. In one example, the driver circuit may have a transistor that has a gate coupled to an output of a pre-driver circuit that receives power from the second power source. A drain of the transistor may be coupled to the I/O pad. In one example, an ESD current enters the IC device through the I/O pad during an ESD event. The first diode and the second diode may be reverse biased before the electrostatic discharge current enters the integrated circuit device.

In some examples, the driver circuit operates at a voltage level greater than a voltage level at which the one or more core circuits operate. In certain examples, the first diode is coupled through a third diode to a ground reference of the IC device. The third diode may have a first terminal coupled to the ground reference and a second terminal coupled to the I/O pad. The second diode may be coupled to the ground reference through a fourth diode. The fourth diode may have a first terminal coupled to the ground reference and a second terminal coupled to the I/O pad through a resistive element that is coupled to a corresponding terminal of the third diode.

In some examples, the ESD protection circuit has a first clamping circuit coupled between the first power source and a ground reference of the IC device and a second clamping circuit coupled between the second power source and the ground reference. The first clamping circuit may be configured to limit variations in voltage difference between the first power source and the ground reference. The second clamping circuit may be configured to limit variations in voltage difference between the second power source and the ground reference. In one example, the interface circuit may be configured to operate as an LPDDR SDRAM interface circuit.

In certain examples, the driver circuit has two PMOS pull-up transistors coupled in series between the first power source and the I/O pad. In some examples, the driver circuit has a plurality of serially-coupled NMOS transistors coupled to the I/O pad.

FIG. 7 is a flow diagram illustrating an example of a method 700 for providing ESD protection in accordance with certain aspects disclosed herein. The method may relate to various features and aspects of the ESD protection circuit illustrated in FIG. 6. At block 702, a first diode is coupled between a first power source of an IC device and an I/O pad of the IC device. The first diode may be configured to divert a first portion of an ESD current that is conducted through the I/O pad. The first power source may be used to supply a driver circuit coupled to the I/O pad. At block 704, a second diode is coupled between a second power source of the IC device and the I/O pad. The second diode may be configured to divert a second portion of the ESD current. The second power source may supply one or more core circuits of the IC device. At block 706, the second diode is coupled to the first diode through a resistive element. The second diode may be coupled to the I/O pad through the resistive element.

In some examples, the resistive element includes an interconnect that couples a terminal of the second diode to a terminal of the first diode and that has a resistance that produces a voltage differential between the terminal of the second diode and the corresponding terminal of the first diode during an ESD event. The resistive element may comprise a parasitic resistance.

In some examples, the driver circuit is configured to receive an input from the one or more core circuits. In one example, the driver circuit may include a transistor that has a gate coupled to an output of a pre-driver circuit that receives power from the second power source. A drain of the transistor is coupled to the I/O pad.

In one example, the ESD current enters the IC device through the I/O pad during an ESD event. The first diode and the second diode may be reverse biased before the ESD current enters the IC device.

In certain examples, the first diode is coupled to a ground reference of the IC device through a third diode. The third diode may have a first terminal coupled to a ground reference and a second terminal coupled to the I/O pad. The second diode may be coupled to the ground reference through a fourth diode. The fourth diode may have a first terminal coupled to the ground reference and a second terminal coupled to the I/O pad through a resistive element that is coupled to a corresponding terminal of the third diode.

In one example, the driver circuit operates at a voltage level greater than a voltage level at which the one or more core circuits operate.

In some examples, a first clamping circuit is coupled between the first power source and a ground reference of the IC device, and a second clamping circuit is coupled between the second power source. The first clamping circuit may be configured to limit variations in voltage difference between the first power source and the ground reference. The second clamping circuit may be configured to limit variations in voltage difference between the second power source and the ground reference. In certain examples, the interface circuit is configured to operate as a LPDDR SDRAM interface circuit.

In some examples, two PMOS pull-up transistors are coupled in series between the first power source and the I/O pad. In certain examples, a plurality of serially-coupled NMOS transistors is coupled to the I/O pad.

It is noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, an apparatus performing certain functions disclosed herein may include means for driving an I/O pad of an IC device, means for diverting a first portion of an ESD current that is conducted through the I/O pad, including a first diode in an interface circuit, the first diode being coupled between a first power source of the IC device and the I/O pad and means for diverting a second portion of the ESD current, including a second diode in the interface circuit, the second diode being coupled between a second power source of the IC device and the I/O pad. The first power source may supply the means for driving the I/O pad. The second power source may supply one or more core circuits of the IC device. A terminal of the second diode may be coupled to the I/O pad through a resistive element coupled to a corresponding terminal of the first diode.

In some examples, the resistive element may include a resistance associated with an interconnect and is configured to produce a voltage differential between the terminal of the second diode and the corresponding terminal of the first diode. The resistive element may comprise one or more parasitic resistances.

In certain examples, the means for driving the I/O pad is configured to receive a controlling input from the one or more core circuits. The means for driving the I/O pad may include a transistor that has a gate coupled to an output of a pre-driver circuit that receives power from the second power source. A drain of the transistor may be coupled to the I/O pad.

In one example, the ESD current enters the IC device through the I/O pad during an ESD event. The first diode and the second diode may be reverse biased before the electrostatic discharge current enters the integrated circuit device.

In one example, the means for driving the I/O pad operates at a voltage level greater than a voltage level at which the one or more core circuits operate.

In certain examples, the apparatus includes means for clamping the first power source to the ground reference, and means for clamping the second power source to the ground reference. The means for clamping the first power source may be configured to limit variations in voltage difference between the first power source and the ground reference. The means for clamping the second power source may be configured to limit variations in voltage difference between the second power source and the ground reference.

In some examples, the means for diverting the first portion of the ESD current includes a third diode configured to couple the first diode to the ground reference and that has a first terminal coupled to the ground reference and a second terminal coupled to the I/O pad, and the means for diverting the second portion of the ESD current includes a fourth diode configured to couple the second diode to the ground reference and that has a first terminal coupled to the ground reference and a second terminal coupled to the I/O pad through the resistive element. The resistive element may be coupled to a corresponding terminal of the third diode.

In certain examples, the interface circuit comprises a LPDDR SDRAM interface circuit. The LPDDR SDRAM interface circuit may include the means for driving the I/O pad. In some examples, the means for driving the I/O pad includes two PMOS pull-up transistors coupled in series between the first power source and the I/O pad. In some examples, the means for driving the I/O pad of the IC device includes a plurality of serially-coupled NMOS transistors coupled to the I/O pad.

Some implementation examples are described in the following numbered clauses:

1. An electrostatic discharge protection circuit, comprising: a first diode in an interface circuit, the first diode being coupled between a first power source of an integrated circuit device and an input/output pad, wherein the first power source supplies a driver circuit coupled to the input/output pad; a second diode in the interface circuit, the second diode coupled between a second power source of the integrated circuit device and the input/output pad; and a resistive element that couples the second diode to the first diode and to the input/output pad.
2. The electrostatic discharge protection circuit as described in clause 1, wherein the resistive element comprises an interconnect that couples a terminal of the second diode to a corresponding terminal of the first diode and that has a resistance that produces a voltage differential between the terminal of the second diode and the corresponding terminal of the first diode during an electrostatic discharge event.
3. The electrostatic discharge protection circuit as described in clause 1 or clause 2, wherein the resistive element comprises a parasitic resistance.
4. The electrostatic discharge protection circuit as described in any of clauses 1-3, wherein the driver circuit is configured to receive a controlling input from the one or more core circuits.
5. The electrostatic discharge protection circuit as described in any of clauses 1-4, wherein the driver circuit comprises a transistor that has a gate coupled to an output of a pre-driver circuit that receives power from the second power source.
6. The electrostatic discharge protection circuit as described in clause 5, wherein a drain of the transistor is coupled to the input/output pad.
7. The electrostatic discharge protection circuit as described in any of clauses 1-6, wherein an electrostatic discharge current enters the integrated circuit device through the input/output pad during an electrostatic discharge event.
8. The electrostatic discharge protection circuit as described in clause 7, wherein the first diode and the second diode are reverse biased before the electrostatic discharge current enters the integrated circuit device.
9. The electrostatic discharge protection circuit as described in any of clauses 1-8, wherein the driver circuit operates at a voltage level greater than a voltage level at which the one or more core circuits operate.
10. The electrostatic discharge protection circuit as described in any of clauses 1-9, further comprising: further comprising: a first clamping circuit coupled between the first power source and a ground reference of the integrated circuit device; and a second clamping circuit coupled between the second power source and the ground reference.
11. The electrostatic discharge protection circuit as described in any of clauses 1-10, wherein the first diode is coupled to a ground reference through a third diode that has a first terminal coupled to the ground reference and a second terminal coupled to the input/output pad, and wherein the wherein the second diode is coupled to the ground reference through a fourth diode that has a first terminal coupled to the ground reference and a second terminal coupled to the input/output pad through the resistive element, wherein the resistive element is coupled to a corresponding terminal of the third diode.
12. The electrostatic discharge protection circuit as described in any of clauses 1-11, wherein the interface circuit comprises a Low-Power Double Data Rate Synchronous Dynamic Random Access Memory (LPDDR SDRAM) interface circuit.
13. The electrostatic discharge protection circuit as described in any of clauses 1-12, wherein the driver circuit comprises: two P-type metal-oxide-semiconductor (PMOS) pull-up transistors coupled in series between the first power source and the input/output pad.
14. The electrostatic discharge protection circuit as described in any of clauses 1-13, wherein the driver circuit comprises: a plurality of serially-coupled N-type metal-oxide-semiconductor (NMOS) transistors coupled to the input/output pad.
15. An apparatus, comprising: means for driving an input/output pad of an integrated circuit device; means for diverting a first portion of an electrostatic discharge current that is conducted through the input/output pad, including a first diode in an interface circuit, the first diode being coupled between a first power source of the integrated circuit device and the input/output pad, wherein the first power source supplies the means for driving an input/output pad; and means for diverting a second portion of the electrostatic discharge current, including a second diode in the interface circuit, the second diode being coupled between a second power source of the integrated circuit device and the input/output pad, wherein the second power source supplies one or more core circuits of the integrated circuit device, and wherein a terminal of the second diode is coupled to the input/output pad through a resistive element coupled to a corresponding terminal of the first diode.
16. The apparatus as described in clause 15, wherein the resistive element comprises a resistance associated with an interconnect and is configured to produce a voltage differential between the terminal of the second diode and the corresponding terminal of the first diode.
17. The apparatus as described in clause 16 or clause 17, wherein the resistive element comprises a parasitic resistance.
18. The apparatus as described in any of clauses 15-17, wherein the means for driving the input/output pad is configured to receive a controlling input from the one or more core circuits.
19. The apparatus as described in any of clauses 15-18, wherein the means for driving the input/output pad comprises a transistor that has a gate coupled to an output of a pre-driver circuit that receives power from the second power source.
20. The apparatus as described in any of clauses 15-19, wherein a drain of the transistor is coupled to the input/output pad.
21. The apparatus as described in any of clauses 15-20, wherein the electrostatic discharge current enters the integrated circuit device through the input/output pad during an electrostatic discharge event.
22. The apparatus as described in any of clauses 15-21, wherein the first diode and the second diode are reverse biased before the electrostatic discharge current enters the integrated circuit device.

23. The apparatus as described in any of clauses 15-22, wherein the means for driving the input/output pad operates at a voltage level greater than a voltage level at which the one or more core circuits operate.
24. The apparatus as described in any of clauses 15-23, further comprising: means for clamping the first power source to a ground reference of the integrated circuit device; and means for clamping the second power source and the ground reference.
25. The apparatus as described in any of clauses 15-24, wherein: the means for diverting the first portion of the electrostatic discharge current includes a third diode configured to couple the first diode to a ground reference and that has a first terminal coupled to the ground reference and a second terminal coupled to the input/output pad, and the means for diverting the second portion of the electrostatic discharge current includes a fourth diode configured to couple the second diode to the ground reference and that has a first terminal coupled to the ground reference and a second terminal coupled to the input/output pad through the resistive element, wherein the resistive element is coupled to a corresponding terminal of the third diode.
26. The electrostatic discharge protection circuit as described in any of clauses 15-25, wherein the interface circuit comprises a Low-Power Double Data Rate Synchronous Dynamic Random Access Memory (LPDDR SDRAM) interface circuit that includes the means for driving an input/output pad.
27. The electrostatic discharge protection circuit as described in any of clauses 15-26, wherein the means for driving the input/output pad of the integrated circuit device comprises: two P-type metal-oxide-semiconductor (PMOS) pull-up transistors coupled in series between the first power source and the input/output pad.
28. The electrostatic discharge protection circuit as described in any of clauses 15-27, wherein the means for driving the input/output pad of the integrated circuit device comprises: a plurality of serially-coupled N-type metal-oxide-semiconductor (NMOS) transistors coupled to the input/output pad.
29. A method for providing electrostatic discharge protection, comprising: coupling a first diode between a first power source of an integrated circuit device and an input/output pad of the integrated circuit device, the first diode being configured to divert a first portion of an electrostatic discharge current that is conducted through the input/output pad, wherein the first power source supplies a driver circuit coupled to the input/output pad; coupling a second diode between a second power source of the integrated circuit device and the input/output pad, the second diode being configured to divert a second portion of the electrostatic discharge current, and wherein the second power source supplies one or more core circuits of the integrated circuit device; and coupling the second diode to the first diode through a resistive element, wherein the second diode is coupled to the input/output pad through the resistive element.
30. The method as described in clause 29, wherein a terminal of the second diode is coupled to the input/output pad through a resistive element coupled to a corresponding terminal of the first diode, and wherein the resistive element comprises a resistance associated with an interconnect and is configured to produce a voltage differential between the terminal of the second diode and the corresponding terminal of the first diode.
31. The method as described in clause 29 or clause 30, wherein the resistive element comprises a parasitic resistance.
32. The method as described in any of clauses 29-31, wherein the driver circuit is configured to receive an input from the one or more core circuits.
33. The method as described in any of clauses 29-32, wherein the driver circuit comprises a transistor that has a gate coupled to an output of a pre-driver circuit that receives power from the second power source.
34. The method as described in clause 33, wherein a drain of the transistor is coupled to the input/output pad.
35. The method as described in any of clauses 29-34, wherein the electrostatic discharge current enters the integrated circuit device through the input/output pad during an electrostatic discharge event.
36. The method as described in any of clauses 29-35, wherein the first diode and the second diode are reverse biased before the electrostatic discharge current enters the integrated circuit device.
37. The method as described in any of clauses 29-36, wherein the driver circuit operates at a voltage level greater than a voltage level at which the one or more core circuits operate.
38. The method as described in any of clauses 29-37, further comprising: coupling a first clamping circuit between the first power source and a ground reference of the integrated circuit device; and coupling a second clamping circuit between the second power source and the ground reference.
39. The method as described in any of clauses 29-38, wherein the first diode is coupled to a ground reference through a third diode that has a first terminal coupled to the ground reference and a second terminal coupled to the input/output pad, and wherein the wherein the second diode is coupled to the ground reference through a fourth diode that has a first terminal coupled to the ground reference and a second terminal coupled to the input/output pad through the resistive element, wherein the resistive element is coupled to a corresponding terminal of the third diode.
40. The method as described in any of clauses 29-39, wherein the interface circuit comprises a Low-Power Double Data Rate Synchronous Dynamic Random Access Memory (LPDDR SDRAM) interface circuit that includes the driver circuit.
41. The method as described in any of clauses 29-40, wherein the means for driving the input/output pad of the integrated circuit device comprises: two P-type metal-oxide-semiconductor (PMOS) pull-up transistors coupled in series between the first power source and the input/output pad.
42. The method as described in any of clauses 29-41, wherein the means for driving the input/output pad of the integrated circuit device comprises: a plurality of serially-coupled N-type metal-oxide-semiconductor (NMOS) transistors coupled to the input/output pad.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An electrostatic discharge protection circuit in an interface circuit, comprising:
    a driver circuit including a first transistor configured to drive an input/output pad of an integrated circuit device, the first transistor being powered by a first power source of the integrated circuit device;
    a pre-driver circuit including a second transistor configured to drive a gate of the first transistor, the second transistor being powered by a second power source of the integrated circuit that supplies power at a second voltage that is lower than a first voltage at which the first power source supplies power to the first transistor;
    a first diode coupled between the first power source and the input/output pad;
    a second diode coupled between the second power source and the input/output pad; and
    a resistive element that couples the second diode to the first diode and to the input/output pad.

2. The electrostatic discharge protection circuit of claim 1, wherein the resistive element comprises an interconnect that couples a terminal of the second diode to a corresponding terminal of the first diode and that has a resistance that produces a voltage differential between the terminal of the second diode and the corresponding terminal of the first diode during an electrostatic discharge event.

3. The electrostatic discharge protection circuit of claim 1, wherein the resistive element comprises a parasitic resistance.

4. The electrostatic discharge protection circuit of claim 1, wherein an output of the first transistor is configured to switch between the first voltage and a ground reference of the integrated circuit device.

5. The electrostatic discharge protection circuit of claim 4, wherein an output of the second transistor is configured to switch between the second voltage and the ground reference of the integrated circuit device.

6. The electrostatic discharge protection circuit of claim 4, wherein a drain of the first transistor is coupled to the input/output pad.

7. The electrostatic discharge protection circuit of claim 1, wherein an electrostatic discharge current enters the integrated circuit device through the input/output pad during an electrostatic discharge event.

8. The electrostatic discharge protection circuit of claim 7, wherein the first diode and the second diode are reverse biased before the electrostatic discharge current enters the integrated circuit device.

9. The electrostatic discharge protection circuit of claim 1, further comprising:
    a first clamping circuit coupled between the first power source and a ground reference of the integrated circuit device; and
    a second clamping circuit coupled between the second power source and the ground reference.

10. The electrostatic discharge protection circuit of claim 1, wherein the first diode is coupled to a ground reference of the integrated circuit device through a third diode that has a first terminal coupled to the ground reference and a second terminal coupled to the input/output pad, and wherein the second diode is coupled to the ground reference through a fourth diode that has a first terminal coupled to the ground reference and a second terminal coupled to the input/output pad through the resistive element, wherein the resistive element is coupled to a corresponding terminal of the third diode.

11. The electrostatic discharge protection circuit of claim 1, wherein the interface circuit comprises a Low-Power Double Data Rate Synchronous Dynamic Random Access Memory (LPDDR SDRAM) interface circuit.

12. The electrostatic discharge protection circuit of claim 1, wherein the driver circuit comprises:
    two P-type metal-oxide-semiconductor (PMOS) pull-up transistors coupled in series between the first power source and the input/output pad.

13. The electrostatic discharge protection circuit of claim 1, wherein the driver circuit comprises:
    a plurality of serially-coupled N-type metal-oxide-semiconductor (NMOS) transistors coupled to the input/output pad.

14. An apparatus, comprising:
    means for driving an input/output pad of an integrated circuit device, including a driver circuit including a first transistor configured to drive an input/output pad of an integrated circuit device, the first transistor being powered by a first power source of the integrated circuit device;
    means for driving a gate of the first transistor, including a pre-driver circuit including a second transistor configured to drive the gate of the first transistor, the second transistor being powered by a second power source of the integrated circuit that supplies power at a second voltage that is lower than a first voltage at which the first power source supplies power to the first transistor;
    means for diverting a first portion of an electrostatic discharge current that is conducted through the input/output pad, including a first diode that is coupled between the first power source and the input/output pad; and
    means for diverting a second portion of the electrostatic discharge current, including a second diode that is coupled between the second power source and the input/output pad, wherein a terminal of the second diode is coupled to the input/output pad through a resistive element coupled to a corresponding terminal of the first diode.

15. The apparatus of claim 14, wherein the resistive element comprises a resistance associated with an interconnect and is configured to produce a voltage differential between the terminal of the second diode and the corresponding terminal of the first diode.

16. The apparatus of claim 14, wherein the resistive element comprises a parasitic resistance.

17. The apparatus of claim 14, wherein an output of the first transistor is configured to switch between the first voltage and the ground reference of the integrated circuit device.

18. The apparatus of claim 14, wherein an output of the second transistor is configured to switch between the second voltage and the ground reference of the integrated circuit device.

19. The apparatus of claim 17, wherein a drain of the first transistor is coupled to the input/output pad.

20. The apparatus of claim 14, wherein the electrostatic discharge current enters the integrated circuit device through the input/output pad during an electrostatic discharge event.

21. The apparatus of claim 20, wherein the first diode and the second diode are reverse biased before the electrostatic discharge current enters the integrated circuit device.

22. The apparatus of claim 14, further comprising:
means for clamping the first power source to a ground reference of the integrated circuit device; and
means for clamping the second power source to the ground reference.

23. The apparatus of claim 14, wherein:
the means for diverting the first portion of the electrostatic discharge current includes a third diode configured to couple the first diode to a ground reference of the integrated circuit device and that has a first terminal coupled to the ground reference and a second terminal coupled to the input/output pad, and
the means for diverting the second portion of the electrostatic discharge current includes a fourth diode configured to couple the second diode to the ground reference and that has a first terminal coupled to the ground reference and a second terminal coupled to the input/output pad through the resistive element, wherein the resistive element is coupled to a corresponding terminal of the third diode.

24. The apparatus of claim 14, wherein the apparatus comprises a Low-Power Double Data Rate Synchronous Dynamic Random Access Memory (LPDDR SDRAM) interface circuit that includes the means for driving an input/output pad.

25. The apparatus of claim 14, wherein the means for driving the input/output pad of the integrated circuit device comprises:
two P-type metal-oxide-semiconductor (PMOS) pull-up transistors coupled in series between the first power source and the input/output pad.

26. The apparatus of claim 14, wherein the means for driving the input/output pad of the integrated circuit device comprises:
a plurality of serially-coupled N-type metal-oxide-semiconductor (NMOS) transistors coupled to the input/output pad.

27. A method for protecting an interface circuit from electrostatic discharge, comprising:
configuring a driver circuit including a first transistor to drive an input/output pad of an integrated circuit device, the first transistor being powered by a first power source of the integrated circuit device;
configuring a pre-driver circuit including a second transistor to drive a gate of the first transistor, the second transistor being powered by a second power source of the integrated circuit that supplies power at a second voltage that is lower than a first voltage at which the first power source supplies power to the first transistor;
coupling a first diode between the first power source and the input/output pad, the first diode being configured to divert a first portion of an electrostatic discharge current that is conducted through the input/output pad;
coupling a second diode between the second power source and the input/output pad, the second diode being configured to divert a second portion of the electrostatic discharge current; and
coupling the second diode to the first diode through a resistive element,
wherein the second diode is coupled to the input/output pad through the resistive element.

28. The method of claim 27, wherein the resistive element comprises an interconnect that couples a terminal of the second diode to a corresponding terminal of the first diode and that has a resistance that produces a voltage differential between the terminal of the second diode and the corresponding terminal of the first diode during an electrostatic discharge event.

29. The method of claim 27, wherein the resistive element comprises a parasitic resistance.

30. The method of claim 27, further comprising:
configuring the first transistor to switch between the first voltage and a ground reference of the integrated circuit device.

31. The method of claim 27, further comprising:
configuring an output of the second transistor to switch between the second voltage and the ground reference of the integrated circuit device.

32. The method of claim 30, further comprising:
coupling a drain of the first transistor in the driver circuit to the input/output pad.

33. The method of claim 27, wherein the electrostatic discharge current enters the integrated circuit device through the input/output pad during an electrostatic discharge event.

34. The method of claim 27, wherein the first diode and the second diode are reverse biased before the electrostatic discharge current enters the integrated circuit device.

35. The method of claim 27, further comprising:
coupling a first clamping circuit between the first power source and a ground reference of the integrated circuit device; and
coupling a second clamping circuit between the second power source and the ground reference.

36. The method of claim 27, wherein the first diode is coupled to a ground reference of the integrated circuit device through a third diode that has a first terminal coupled to the ground reference and a second terminal coupled to the input/output pad, and wherein the second diode is coupled to the ground reference through a fourth diode that has a first terminal coupled to the ground reference and a second terminal coupled to the input/output pad through the resistive element, wherein the resistive element is coupled to a corresponding terminal of the third diode.

37. The method of claim 27, wherein the interface circuit comprises a Low-Power Double Data Rate Synchronous Dynamic Random Access Memory (LPDDR SDRAM) interface circuit that includes the driver circuit.

38. The method of claim 27, further comprising:
coupling two P-type metal-oxide-semiconductor (PMOS) pull-up transistors in series between the first power source and the input/output pad.

39. The method of claim 27, further comprising:
coupling a plurality of serially-coupled N-type metal-oxide-semiconductor (NMOS) transistors to the input/output pad.

* * * * *